(12) United States Patent
Chou et al.

(10) Patent No.: US 9,853,091 B2
(45) Date of Patent: Dec. 26, 2017

(54) SIDE BOTTOM CONTACT RRAM STRUCTURE

(71) Applicant: Taiwan Semiconductor Manufacturing Co., Ltd., Hsin-Chu (TW)

(72) Inventors: Chung-Yen Chou, Hsinchu (TW); Ching-Pei Hsieh, Kaohsiung (TW); Chia-Shiung Tsai, Hsin-Chu (TW); Shih-Chang Liu, Alian Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/138,436

(22) Filed: Apr. 26, 2016

(65) Prior Publication Data
US 2017/0309682 A1 Oct. 26, 2017

(51) Int. Cl.
*H01L 27/24* (2006.01)
*H01L 45/00* (2006.01)
*H01L 23/528* (2006.01)
*H01L 23/522* (2006.01)
*G11C 13/00* (2006.01)

(52) U.S. Cl.
CPC ...... *H01L 27/2463* (2013.01); *G11C 13/0007* (2013.01); *H01L 23/528* (2013.01); *H01L 23/5226* (2013.01); *H01L 45/08* (2013.01); *H01L 45/1233* (2013.01); *H01L 45/1253* (2013.01); *H01L 45/146* (2013.01); *H01L 45/147* (2013.01); *H01L 45/1608* (2013.01); *H01L 45/1666* (2013.01); *G11C 2213/31* (2013.01); *G11C 2213/32* (2013.01); *G11C 2213/52* (2013.01)

(58) Field of Classification Search
CPC ............... H01L 27/2463; H01L 45/122; H01L 45/1233; H01L 45/1253
See application file for complete search history.

(56) References Cited

U.S. PATENT DOCUMENTS

| 7,718,989 B2* | 5/2010 | Lai | G11C 11/5678 257/2 |
| 8,084,842 B2* | 12/2011 | Chen | G11C 11/5678 257/246 |
| 8,995,170 B2* | 3/2015 | Kawashima | H01L 27/101 365/148 |

* cited by examiner

*Primary Examiner* — Allison P Bernstein
(74) *Attorney, Agent, or Firm* — Eschweiler & Potashnik, LLC

(57) ABSTRACT

The present disclosure relates to an integrated circuits device having an RRAM cell, and an associated method of formation. In some embodiments, the integrated circuit device has a lower metal interconnect line disposed within a lower inter-level dielectric (ILD) layer and an upper metal interconnect line disposed within an upper inter-level dielectric (ILD) layer. The integrated circuit device also has a memory cell array disposed between the lower metal interconnect line and the upper metal interconnect line, including memory cells arranged in rows and columns, the memory cells respectively includes a bottom electrode and a top electrode separated by a RRAM dielectric having a variable resistance. A bottom contact structure is disposed on the lower metal interconnect line and along sidewalls of the bottom electrode, electrically coupling the lower metal interconnect line and the bottom electrode.

20 Claims, 4 Drawing Sheets

SIDE BOTTOM CONTACT RRAM STRUCTURE

BACKGROUND

Many modern electronic devices contain electronic memory configured to store data. Electronic memory may be volatile memory or non-volatile memory. Volatile memory stores data only while it is powered, while non-volatile memory is able to keep data when power is removed. Resistive random access memory (RRAM) is one promising candidate for next generation non-volatile memory technology due to its simple structure and CMOS logic compatible process technology that is involved. An RRAM cell includes a dielectric data storage layer having a variable resistance, which is placed between two electrodes disposed within interconnect metallization layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
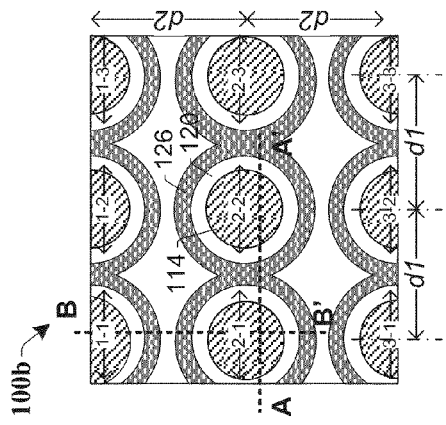
FIG. 1B illustrates some embodiments of a top view of an integrated circuit device including a resistive random access memory (RRAM) array having a side bottom contact structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In recent years, resistive random access memory (RRAM) cells have emerged as a promising candidate for next generation electronic data storage. An RRAM cell comprises a conductive bottom electrode separated from a conductive top electrode by a dielectric data storage layer having a variable resistance. The RRAM cell stores data based upon resistive switching, which allows for the RRAM cell to change the electrical resistance of its dielectric data storage layer between a high resistive state corresponding to a first data state (e.g., a "0") and a low resistive state corresponding to a second data state (e.g., a "1").

The conductive bottom electrode of an RRAM cell is typically connected to an underlying metal line by a conductive via. The conductive via can be formed by etching an opening within a dielectric layer and then filling a conductive material that extends into the opening. However, it has been appreciated that as the size of RRAM cells continue to decrease, the conductive material often fails to properly fill the opening in the dielectric layer. This results in a depression within an upper surface of the bottom electrode and/or an unwanted void within the conductive via and the bottom electrode. The depression or the void within the upper surface of the bottom electrode may lead to non-planar topographies for the overlying layers. The non-planar topographies can negatively affect the ability of an RRAM cell to store data and the reliability of an RRAM cell.

The present disclosure relates to an integrated circuit including an RRAM cell having a side bottom contact structure disposed alongside a bottom electrode to connect the bottom electrode to an underlying metal line that provides for planar RRAM topographies, and an associated self-aligned method of formation. In some embodiments, the integrated circuit comprises a lower metal interconnect line disposed within a lower inter-level dielectric (ILD) layer and a top metal interconnect line disposed within an upper inter-level dielectric (ILD) layer. The RRAM cell has a bottom electrode and a top electrode separated by a RRAM dielectric having a variable resistance. A bottom contact structure is disposed on the lower metal interconnect line and along sidewalls of the bottom electrode, electrically coupling the lower metal interconnect line and the bottom electrode. The bottom contact structure is formed alongside the bottom electrode, not within an opening underlying the bottom electrode, thereby giving the bottom electrode a planar upper surface that avoids and/or limits topography problems in overlying layers. In some embodiments, the bottom contact structure is formed through a self-aligned process after forming and patterning the top electrode layer and bottom electrode layer of the RRAM cell, thereby eliminating or reducing complex patterning processes for forming bottom conductive vias.

Figure 1A:
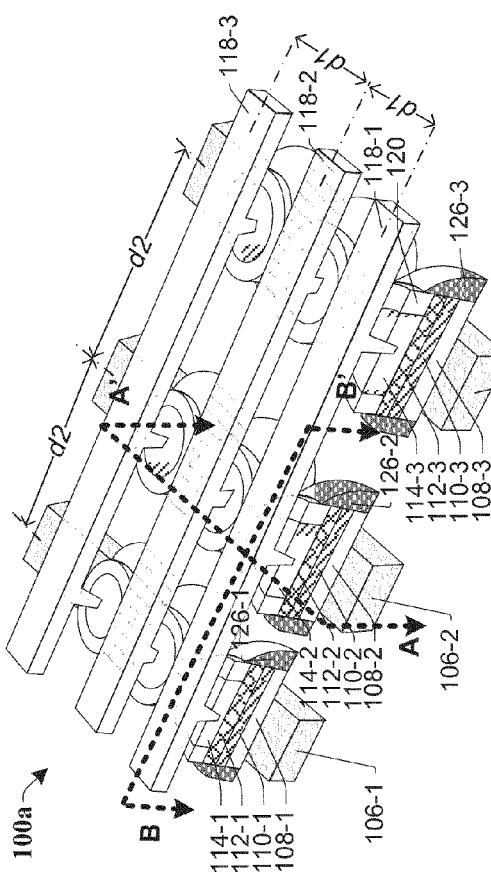
FIG. 1A illustrates some embodiments of a perspective view of an integrated circuit device including a resistive random access memory (RRAM) array having a side bottom contact structure.

FIGS. 1A-1B illustrate some embodiments of an integrated circuit device including a resistive random access memory (RRAM) array. As shown in a three-dimensional view 100a and a top view 100b, the RRAM array comprises a plurality of RRAM cells (e.g. 1-1, 1-2, 1-3, . . . ). The RRAM cells are arranged in rows and columns and are connected to a plurality of lower metal interconnect lines (106 such as 106-1, 106-2, 106-3) and upper metal interconnect lines (118 such as 118-1, 118-2, 118-3). The lower metal interconnect lines 106 extend in parallel with one another and can have a first periodic spacing where neighboring lower metal interconnect lines are equally spaced, although in other embodiments neighboring lower metal interconnect lines can also have different spacings. The upper metal interconnect lines 118 can also extend in parallel with one another and can have a second periodic spacing where neighboring upper metal interconnect lines are equally spaced, although in other embodiments neighboring upper metal interconnect lines can also have different spacings.

Each RRAM cell includes a conductive bottom electrode 110 separated from a conductive top electrode 114 by a RRAM dielectric 112 having a variable resistance. To discuss these elements for the various cells, the bottom electrodes 110 are labeled as 110-1, 110-2, and 110-3, the RRAM dielectric 112 are labeled as 112-1, 112-2, 112-3, the top electrodes are labeled as 114-1, 114-2, 114-3, and so on. A bottom dielectric layer 108, which includes bottom dielectric pads 108-1, 108-2, and 108-3, separates lower surfaces of the conductive bottom electrodes 110 from upper surfaces of the lower metal interconnect lines 106.

Memory cells 1-1, 1-2 and 1-3 are arranged in a first row and have their conductive bottom electrodes 110 electrically coupled to a first lower metal interconnect line 106-1; memory cells 2-1, 2-2 and 2-3 are arranged in a second row and have their conductive bottom electrodes 110 electrically coupled to a second lower metal interconnect line 106-2; and memory cells 3-1, 3-2 and 3-3 are arranged in a third row and have their conductive bottom electrodes 110 electrically coupled to a third lower metal interconnect line 106-3. Among those memory cells, the memory cells 1-1, 2-1 and 3-1 are arranged in a first column and have their conductive top electrodes 114 electrically coupled to a first upper metal interconnect line 118-1; the memory cells 1-2, 2-2 and 3-2 are arranged in a second column and have their conductive top electrodes 114 electrically coupled to a second upper metal interconnect line 118-2; and the memory cells 1-3, 2-3 and 3-3 are arranged in a third column and have their conductive top electrodes 114 electrically coupled to a third upper metal interconnect line 118-3. In some embodiments, the lower metal interconnect lines 106 (e.g., 106-1, 106-2 and 106-3) are configured as bit lines of the RRAM array for reading or writing data values to the memory cells, while the upper metal interconnect lines 118 (e.g. 108-1, 108-2 and 108-3) are configured as word lines of the RRAM array for accessing the memory cells. In other embodiments, the lower metal interconnect lines 106 are configured as word lines of the RRAM array, while the upper metal interconnect lines 118 are configured as bit lines.

A bottom contact structure 126 is disposed at a peripheral region of the memory cells. The bottom contact structure 126 includes conductive segments that extend continuously between at least two memory cells arranged in a row direction A-A'. For example, the bottom contact structure includes a first segment 126-1 that extends continuously between the memory cells 1-1, 1-2 and 1-3 in the first row, and a second segment 126-2 extends continuously between the memory cells 2-1, 2-2 and 2-3 in the second row. In some embodiments, the first and second segments 126-1, 126-2 are physically and electrically isolated from one another in the column direction B-B'. A row distance d1 between two neighboring memory cells in the row direction (e.g. between the memory cells 2-1, 2-2) is smaller than a column distance d2 between two neighboring memory cells in the column direction (e.g. between the memory cells 1-2, 2-2).

A first group of bottom dielectric pads, which includes for example dielectric pad 108-1, are disposed over a first lower metal interconnect line 106-1. The dielectric pads of the first group have outermost edges that are spaced apart from one another along a length of that first lower metal interconnect line 106-1. A first group of bottom electrodes, which include bottom electrode 110-1, are disposed over the first group of bottom dielectric pads, respectively. A first group of RRAM dielectric structures, which include RRAM dielectric structure 112-1, each have a variable resistance and are disposed over the first group of bottom electrodes, respectively. A first group of top electrodes, which include top electrode 114-1, are disposed over the first group of RRAM dielectric structures, respectively. A first bottom contact structure 126-1 is disposed over the first lower metal interconnect line 106-1 and includes a first group of ring-shaped contact structures that surround the first group of bottom electrodes, respectively. The first group of ring-shaped contact structures electrically couple the first lower metal interconnect line 106-1 to outer sidewalls of the first group of bottom electrodes, respectively. In the illustrated embodiment, the first group of ring-shaped contact structures adjoin one another along the length of the first lower metal interconnect line 106-1, such that the ring-shaped contact structures are electrically coupled to one another along the length of the first lower metal interconnect line 106-1.

A second group of bottom dielectric pads, which includes for example dielectric pad 108-2, are disposed over a second lower metal interconnect line 106-2 and are spaced apart from one another along a length of that second lower metal interconnect line 106-2. A second group of bottom electrodes, which include bottom electrode 110-2, are disposed over the second group of bottom dielectric pads, respectively, and a second group of RRAM dielectric structures, which include RRAM dielectric structure 112-2, each have a variable resistance and are disposed over the second group of bottom electrodes, respectively. A second group of top electrodes, which include top electrode 114-2, are disposed over the second group of RRAM dielectric structures, respectively. A second bottom contact structure 126-2 is disposed over the second lower metal interconnect line and includes a second group of ring-shaped contact structures that surround the second group of bottom electrodes, respectively. The second group of ring-shaped contact structures electrically couple the second lower metal interconnect line 106-2 to outer sidewalls of the second group of bottom electrodes, respectively. In the illustrated embodiment, the second group of ring-shaped contact structures adjoin one another along the length of the second lower metal interconnect line, such that the ring-shaped contact structures are electrically coupled to one another along the length of the line. In other embodiments, the individual ring-shaped contact structures of the first group can be spaced apart from one another, and the individual ring-shaped contact structures of the second group can be spaced apart from one another as well, such that each cell corresponds to a separate ring-shaped contact structure that is spaced apart from the other ring-shaped contact structure.

In FIG. 1A, the ring-shaped bottom contact structures 126 (e.g., the first and second contact structures 126-1, 126-2) are rounded or circular as viewed from above, and have a rounded outer sidewall. This rounded outer sidewall can taper from its uppermost portion to its lowermost portion, such that the uppermost portion has a first outermost perimeter and the lowermost portion has a second outermost perimeter that is greater than the first outermost perimeter. In other embodiments, the ring-shaped bottom contact structures 126 can be square, rectangular, or polygonal, and can have rounded corners, as viewed from above. Further, the outer sidewall of any of these structures, rather than having a tapered outer sidewall, can be a vertical or substantially vertical sidewall and the uppermost surface of the ring-shaped contact structures can be planar or substantially planar. Structures of the memory cells including the bottom contact structure 126 of some embodiments are shown in more detail in following figures.

Figure 2A:
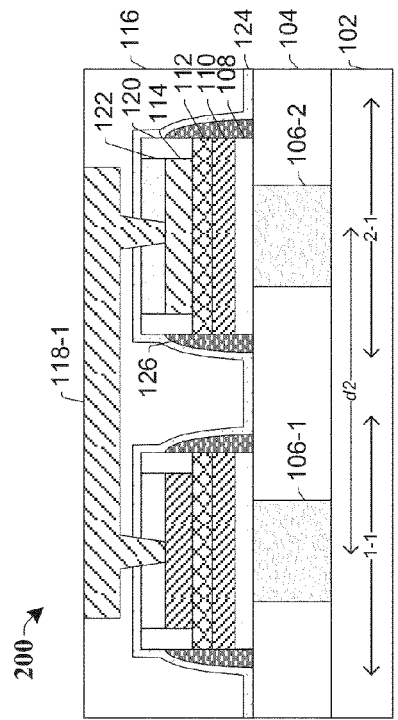
FIGS. 2A-2B illustrate cross-sectional views of some embodiments of an integrated circuit device including an RRAM cell having a side bottom contact structure, consistent with FIGS. 1A-1B.
Figure 2B:
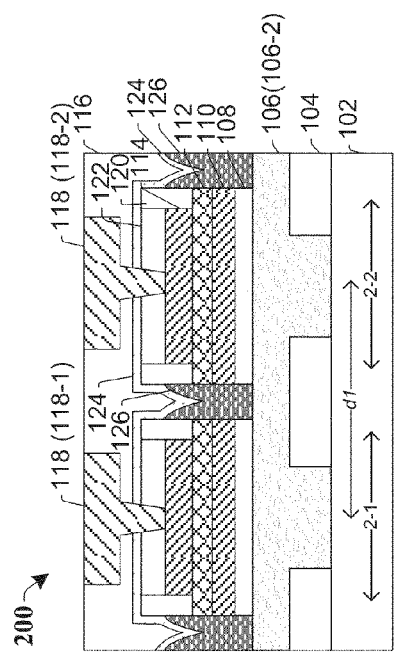

FIGS. 2A-2B illustrate cross-sectional views of some embodiments of an integrated circuit device 200 disposed over a substrate 102 and including a bottom contact structure 126. FIG. 2A shows the cross-sectional view along a row direction A-A', and FIG. 2B shows the cross-sectional view along a column direction B-B' shown in FIG. 1B. In some embodiments, the integrated circuit device 200 comprises a lower metal interconnect line 106 disposed within a lower inter-level dielectric (ILD) layer 104 and an upper metal interconnect line 118 disposed within an upper inter-level dielectric (ILD) layer 116. The lower and upper metal interconnect lines 106, 118 may comprise conductive material such as copper or aluminum. The lower and upper ILD layers 104, 116 may comprise silicon dioxide ($SiO_2$), a low-k dielectric material, or extreme low-k (ELK) dielectric material. A memory cell array is disposed between the lower metal interconnect line 106 and the upper metal interconnect line 118, including memory cells 2-1, 2-2 and 1-1. In some embodiments, the memory cells 2-1 and 2-2 are arranged in the row direction A-A' with a row distance d1. The memory cells 1-1 and 2-1 are arranged in the column direction B-B' with a column distance d2 greater than the row distance d1. In some embodiments, the lower metal interconnect line 106 (e.g. the metal line 106-2) extends continuously between the memory cells 2-1 and 2-2 in the row direction A-A'. The lower metal interconnect line 106 comprises separate metal lines coupled to the memory cells in the column direction B-B'. For example, the lower metal interconnect line 106 comprises a first metal interconnect line 106-1 coupled to the memory cell 1-1 and the second lower metal interconnect line 106-2 coupled to the memory cell 2-1 in the column direction B-B'. The bottom contact structure 126 is disposed on the lower metal interconnect line 106 and/or the lower ILD layer 104 and along sidewalls of the memory cells 2-1, 2-2 and 1-1, electrically coupling the lower metal interconnect line 106 to bottom electrodes 110 of memory cells. For example, the bottom contact structure 126 continuously couples the metal line 106-2 to the bottom electrodes 110 of the memory cells 2-1, 2-2. In some embodiments, the bottom contact structure 126 comprises titanium (Ti), tantalum (Ta), titanium nitride (TiN), or tantalum nitride (TaN). By forming the bottom contact structure 126 along sides of the bottom electrodes 110, not within an opening underlying the bottom electrodes 110, the bottom electrode 110 can have a planar upper surface that avoids topography problems in overlying layers.

In some embodiments, a bottom dielectric layer 108 is disposed over the lower metal interconnect line 106 and/or the lower ILD layer 104, separating the bottom electrode 110 from the lower metal interconnect line 106 and/or the lower ILD layer 104. The memory cells 2-1, 2-2 and 1-1 also respectively comprises a RRAM dielectric 112 disposed on the bottom electrode 100, and a top electrode 114 disposed over the RRAM dielectric 112. In some embodiments, the bottom electrode 110 and the top electrode 114 comprise titanium (Ti), tantalum (Ta), titanium nitride (TiN), or tantalum nitride (TaN). The RRAM dielectric 112 has a variable resistance and is configured to undergo a reversible phase change between a high resistance state and a low resistance. For example, the RRAM dielectric 112 may include a transitional metal oxide comprising one or more layers of hafnium oxide ($HfO_x$), aluminum oxide ($AlO_x$) tantalum oxide ($TaO_x$), or other composite combinations such as hafnium aluminum oxide (HfAlO). The bottom dielectric layer 108 may comprise silicon carbide.

In some embodiments, a sidewall spacer 120 is disposed over the RRAM dielectric 112 and along sidewalls of the top electrode 114, having an outer sidewall vertically aligned with a sidewall of the bottom electrode 110. In some embodiments, a hard mask 122 is disposed over the top electrode 114, having a sidewall vertically aligned with a sidewall of the top electrode 114. In some embodiments, the upper metal interconnect line 118 is electrically coupled to the top electrode 114 through an upper metal via, which is disposed through a hole within the hard mask 122 and contacts to the top electrode 114. The sidewall spacer 120 and the hard mask 122 may comprise silicon dioxide. In some alternative embodiments, the hard mask 122 may comprise silicon oxy-nitride (SiON), silicon carbide (SiC), silicon-nitride ($SiN_x$), or other composite dielectric films.

In some embodiments, the bottom contact structure 126 extends upwardly along sidewalls of the bottom dielectric layer 108, the bottom electrode 110, the RRAM dielectric 112 and the sidewall spacer 120, reaching a lateral positional higher than a lower surface of the top electrode 114. A top dielectric layer 124 may be disposed over the lower metal interconnect line 106 and/or the lower ILD layer 104, continuously extending along sidewalls of the bottom contact structure 126 and the sidewall spacer 120, and overlying a top surface of the top electrode 114. In some embodiments, the top dielectric layer 124 can be a conformal layer that extends along sidewalls of the bottom contact structure 126 and sidewall spacer 120. The top dielectric layer 124 separates the top electrode 114 and the RRAM dielectric 112 from the upper ILD layer 116. In some embodiments, the bottom dielectric layer 108 and the top dielectric layer 124 may comprise the same dielectric material or different dielectric materials such as silicon carbide (SiC), silicon nitride ($SiN_x$), or one or more layers of composite dielectric films.

It is appreciated that though not shown in the FIGS. 2A-2B for purposes of simplicity, some extra layers are arranged within the integrated circuit device 200. For example, in some embodiments, a plurality of selectors (not shown in the figure) is respectively coupled between the upper metal interconnect lines 118 and the conductive top electrode 114 of the RRAM cells. In some embodiments, the selectors can be various non-transistor based components such as metal-insulator-metal (MIM) diodes. In some embodiments, a capping layer can be disposed between the RRAM dielectric 112 and the top electrode 114. The capping layer has a lower concentration of oxygen than the RRAM dielectric 112, and is configured to extract oxygen from the RRAM dielectric 112 to facilitate resistance changes within the RRAM dielectric 112. In various embodiments, the capping layer may comprise titanium (Ti), Hafnium (Hf), Platinum (Pt), Ruthenium (Ru) or other composite metal films. In some embodiments, a diffusion barrier layer may be deposited on the lower metal interconnect line 106 (and possibly along the sidewall of the bottom electrode 110) prior to deposition of the bottom contact structure 126, to prevent diffusion between the lower metal interconnect line 106 and the bottom contact structure 126. The diffusion barrier layer may comprise tantalum nitride, while the bottom contact structure 126 is made of titanium nitride for lower resistivity.

FIGS. 3A-B, 4A-B, 5A-B, 6A-B, 7A-B and 8A-B illustrate cross-sectional views of some embodiments showing manufacturing processes of a method of forming an integrated circuit device including an RRAM cell having a side bottom contact structure.

Figure 3A:
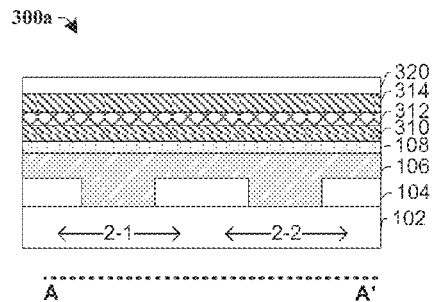
FIGS. 3A-3B, 4A-4B, 5A-5B, 6A-6B, 7A-7B and 8A-8B illustrate cross-sectional views of some embodiments showing manufacturing processes of a method of forming an integrated circuit device including an RRAM cell having a side bottom contact structure.
Figure 3B:
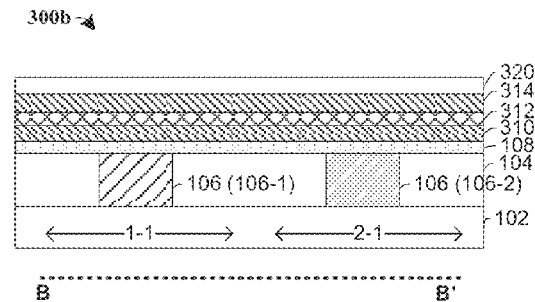

As shown in cross-sectional view 300a of FIG. 3A along a row direction A-A' and cross-sectional view 300b of FIG. 3B along a column direction B-B', a lower metal interconnect line 106 is formed within a lower ILD layer 104 (e.g., an oxide, a low-k dielectric, or an ultra-low-k dielectric). In some embodiments, the lower metal interconnect line 106 may be continuous between at least two memory cells in the row direction A-A' (e.g. 2-1 and 2-2), and be discrete between memory cells in the column direction B-B' (e.g. 1-1 and 2-1). In some embodiments, the lower metal interconnect line 106 may be formed by selectively etching the lower ILD layer 104 (e.g., an oxide, a low-k dielectric, or an ultra-low-k dielectric) to form trenches in the lower ILD layer 104. A metal (e.g., copper, aluminum, etc.) is then deposited to fill the trenches, and a planarization process is performed to remove excess metal to form the lower metal interconnect line 106.

A bottom dielectric layer 108, a bottom electrode layer 310, a RRAM dielectric layer 312, a top electrode layer 314, and a hard mask layer 320 are formed in succession over the lower metal interconnect line 106 and the lower ILD layer 104 to form un-patterned RRAM stack layers. In some embodiments, the RRAM stack layers may be formed by a plurality of vapor deposition techniques (e.g., physical vapor deposition, chemical vapor deposition, etc.). The bottom dielectric layer 108 may comprise silicon-nitride (SiN), silicon-carbide (SiC), or a similar composite dielectric film. The bottom electrode layer 310 and the top electrode layer 314 may comprise a metal nitride (e.g., titanium nitride (TiN) or tantalum nitride (TaN) or a metal (e.g., titanium (Ti) or tantalum (Ta)). The RRAM dielectric layer 312 may comprise a high-k dielectric material having a variable resistance. For example, in some embodiments, the RRAM dielectric layer 312 may comprise a metal oxide composite such as hafnium oxide ($HfO_x$), zirconium oxide ($ZrO_x$), aluminum oxide ($AlO_x$), nickel oxide ($NiO_x$), tantalum oxide ($TaO_x$), or titanium oxide ($TiO_x$) in its relatively high resistance state, and may comprise a metal such as titanium (Ti), hafnium (Hf), platinum (Pt), ruthenium (Ru), and/or aluminum (Al) in its relatively low resistance state. The hard mask layer 320 may comprise an oxygen containing dielectric, such as silicon-oxide ($SiO_2$) or silicon-oxynitride (SiON). In other embodiments, the hard mask layer 320 may comprise a hard mask layer that is substantially devoid of oxygen, such as silicon-nitride (SiN) silicon-carbide (SiC), or a composite dielectric film that is substantially devoid of oxygen.

Figure 4A:
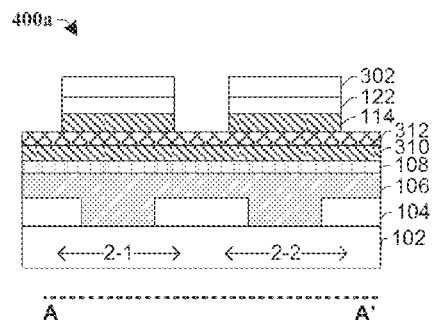
Figure 4B:
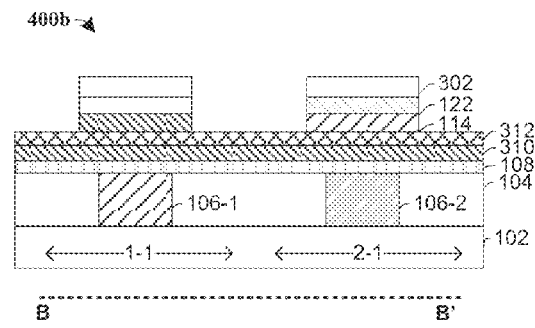

As shown in cross-sectional view 400a of FIG. 4A along the row direction A-A' and cross-sectional view 400b of FIG. 4B along the column direction B-B', the top electrode layer 314 is patterned to form a top electrode 114. In some embodiments, the hard mask layer 320 is firstly patterned to form a hard mask 122 by a photolithography process using a photoresist mask 302, which is subsequently removed. The top electrode is then etched according to the hard mask 122 using an etching process, which may comprise a dry etching process (e.g., using a plasma etchant, a RIE etchant, etc.) or a wet etching process (e.g., using hydrofluoric acid (HF)).

Figure 5A:
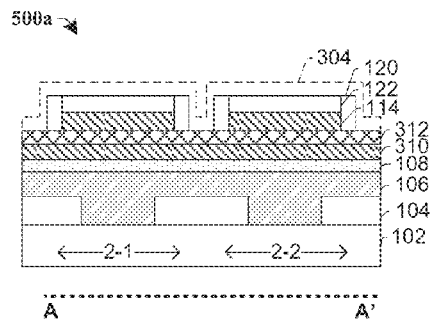
Figure 5B:
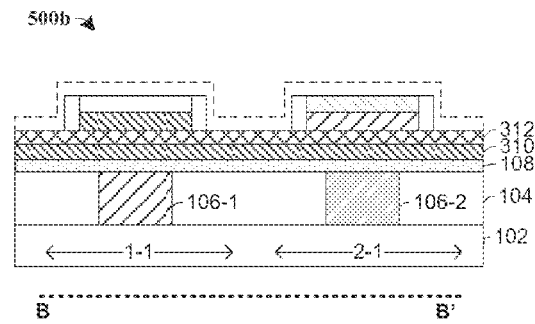

As shown in cross-sectional view 500a of FIG. 5A along the row direction A-A' and cross-sectional view 500b of FIG. 5B along the column direction B-B', a sidewall spacer 120 is formed on opposing sides of the top electrode 114 and the hard mask 122. In some embodiments, the sidewall spacer 120 may be formed by depositing a conformal dielectric layer 304 followed by an anisotropic etching process to remove lateral portions and to leave vertically portions along the opposing sides of the top electrode 114 and the hard mask 122. In some embodiments, the sidewall spacer 120 may comprise silicon nitride.

Figure 6A:
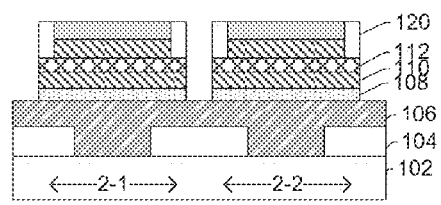
Figure 6B:
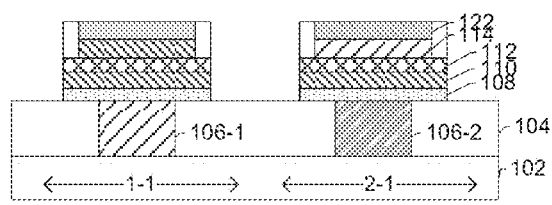

As shown in cross-sectional view 600a of FIG. 6A along the row direction A-A' and cross-sectional view 600b of FIG. 6B along the column direction B-B', the RRAM dielectric layer 312 and the bottom electrode layer 310 (shown in FIGS. 5A-B) are patterned to form a RRAM dielectric 112 and a bottom electrode 110. In some embodiments, the RRAM dielectric layer 312 and the bottom electrode layer 310 are etched according to the hard mask 122 and the sidewall spacer 120, using an etching process, which may comprise a dry etching process (e.g., using a plasma etchant, a RIE etchant, etc.) or a wet etching process (e.g., using hydrofluoric acid (HF)). In some embodiments, the bottom dielectric layer 108 is also patterned subsequently in this step, having a sidewall aligned with a sidewall of the bottom electrode 110.

Figure 7A:
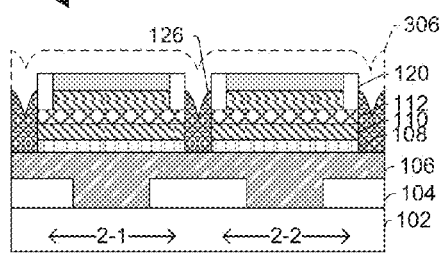
Figure 7B:
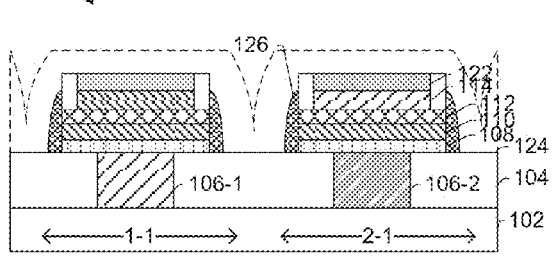

As shown in cross-sectional view 700a of FIG. 7A along the row direction A-A' and cross-sectional view 700b of FIG. 7B along the column direction B-B', a bottom contact structure 126 may be formed by depositing one or more conductive layers followed by an anisotropic etching process to remove lateral portions and to leave vertically portions along the sidewall of the bottom electrode 110. In some embodiments, the bottom contact structure 126 may be formed by a vapor deposition technique, such as a chemical vapor deposition process or an atom layer deposition process, followed by a vertical dry etch process, such as a plasma etching process. In various embodiments, the bottom contact structure 126 may comprise a metal nitride (e.g., titanium nitride (TiN) or tantalum nitride (TaN) or a metal (e.g., titanium (Ti) or tantalum (Ta)). In some embodiments, a diffusion barrier layer (not shown) may be deposited on the lower metal interconnect line 106 and along the sidewall of the bottom electrode 110 prior to deposition of the bottom contact structure 126 to prevent diffusion between the lower metal interconnect line 106 and the bottom contact structure 126.

Figure 8A:
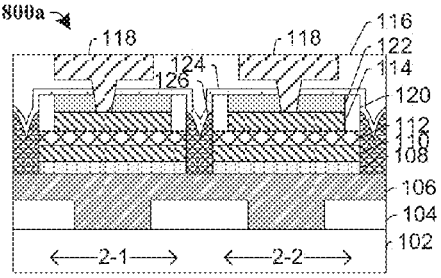
Figure 8B:
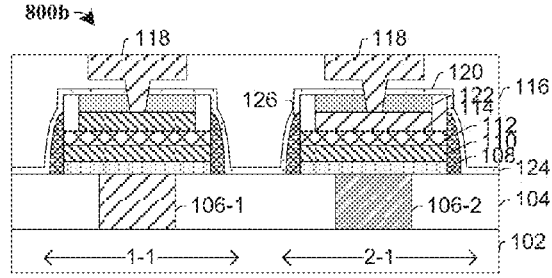

As shown in cross-sectional view 800a of FIG. 8A along the row direction A-A' and cross-sectional view 800b of FIG. 8B along the column direction B-B', a conformal top dielectric layer 124 is formed over the lower metal interconnect line 106, continuously extending along sidewalls of the bottom contact structure 126 and the sidewall spacer 120, and overlying a top surface of the top electrode 114. In some embodiments, the top dielectric layer 124 may comprise silicon carbide (SiC), silicon nitride ($SiN_x$), or one or more layers of composite dielectric films. An upper metal interconnect line 118 is formed over the top dielectric layer 124 within an upper ILD layer 116. An upper metal via can be formed through the top dielectric layer 124 and connects the top electrode 114 to the upper metal interconnect line 118.

Figure 9:
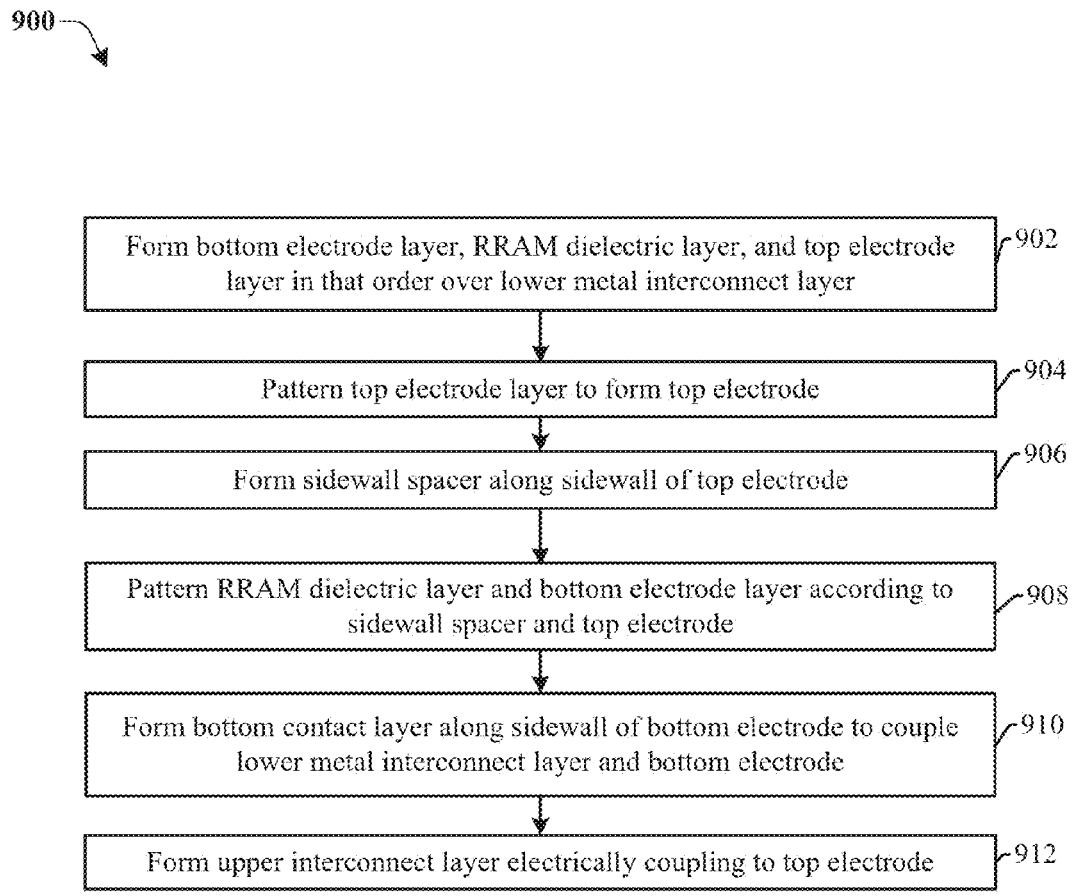
FIG. 9 illustrates a flow diagram of some embodiments of a method of forming an integrated circuit device including an RRAM cell having a side bottom contact structure.

FIG. 9 illustrates a flow diagram of some embodiments of a method of forming an integrated circuit device including an RRAM cell having a side bottom contact structure. Examples of the integrated circuit device are shown above in FIGS. 2A-8B.

Although the method 900 is described in relation to FIGS. 2A-8B, it will be appreciated that the structures disclosed in FIGS. 2A-8B are not limited to the method 900, but instead may stand alone as structures independent of the method 900. Similarly, although the method 900 is described in relation to FIGS. 2A-8B, it will be appreciated that the method 900 is not limited to the structures disclosed in FIGS. 2A-8B, but instead may stand alone independent of the structures disclosed in FIGS. 2A-8B. Also, while disclosed methods (e.g., methods 900) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 902, bottom electrode layer, RRAM dielectric layer, and top electrode layer are formed in that order over a lower metal interconnect line to form un-patterned RRAM stack layers. In some embodiments, the RRAM stack layers may be formed by a plurality of vapor deposition techniques (e.g., physical vapor deposition, chemical vapor deposition, etc.). FIGS. 3A-3B illustrate some embodiments of a cross-sectional views 300a-300b corresponding to act 902.

At 904, a top electrode layer is patterned to form a top electrode. In some embodiments, a hard mask layer is firstly formed and patterned over the top electrode layer to form a hard mask by a photolithography process using a photoresist mask. The top electrode layer is then etched according to the hard mask using a dry etching process (e.g., using a plasma etchant, a RIE etchant, etc.) or a wet etching process (e.g., using hydrofluoric acid (HF)). FIGS. 4A-4B illustrate some embodiments of a cross-sectional views 400a-400b corresponding to act 904.

At 906, a sidewall spacer is formed along a sidewall of the top electrode. In some embodiments, the sidewall spacer may be formed by depositing a conformal dielectric layer followed by an anisotropic etching process to remove lateral portions and to leave vertically portions along the opposing sides of the top electrode. FIGS. 5A-5B illustrate some embodiments of a cross-sectional views 500a-500b corresponding to act 906.

At 908, RRAM dielectric layer and bottom electrode layer are formed self-aligned. The RRAM dielectric layer and the bottom electrode layer are patterned according to the sidewall spacer and the top electrode. In some embodiments, the RRAM dielectric layer and the bottom electrode layer have sidewalls vertically aligned with an outer sidewall of the top electrode. FIGS. 6A-6B illustrate some embodiments of a cross-sectional views 600a-600b corresponding to act 908.

At 910, a bottom contact structure is formed along the sidewall of the bottom electrode to couple the lower metal interconnect line and the bottom electrode. In some embodiments, the bottom contact structure is formed in conformal by a vapor deposition technique, followed by a anisotropic etch process to remove lateral portions and to leave vertical portions along the sidewall of the bottom electrode. FIGS. 7A-7B illustrate some embodiments of a cross-sectional views 700a-700b corresponding to act 910.

At 912, an upper interconnect layer is formed over the top electrode within an upper ILD layer, electrically coupling to the top electrode. FIGS. 8A-8B illustrate some embodiments of a cross-sectional views 800a-800b corresponding to act 912.

Therefore, the present disclosure relates to an RRAM (resistive random access memory) cell having a side bottom contact structure, and an associated method of formation.

In some embodiments, the present disclosure relates to an integrated circuit device. The integrated circuit device comprises a lower metal interconnect line disposed within a lower inter-level dielectric (ILD) layer and an upper metal interconnect line disposed within an upper inter-level dielectric (ILD) layer. The integrated circuit device further comprises a memory cell array disposed between the lower metal interconnect line and the upper metal interconnect line, including memory cells arranged in rows and columns. The memory cells respectively comprises a bottom electrode and a top electrode separated by a RRAM dielectric having a variable resistance. A bottom contact structure is disposed on the lower metal interconnect line and along sidewalls of the bottom electrode, electrically coupling the lower metal interconnect line and the bottom electrode.

In some other embodiments, the present disclosure relates to an integrated circuit device. The integrated circuit device comprises a lower metal interconnect line disposed within a lower inter-level dielectric (ILD) layer and over a substrate. The integrated circuit device further comprises a bottom dielectric layer disposed over the lower metal interconnect line and the lower ILD layer and a bottom electrode disposed over the bottom dielectric layer. The integrated circuit device further comprises a RRAM dielectric having a variable resistance, disposed on the bottom electrode and a top electrode disposed over the RRAM dielectric. The integrated circuit device further comprises a top metal interconnect line disposed within an upper inter-level dielectric (ILD) layer and electrically coupled to the top electrode. A bottom contact structure is disposed on the lower metal interconnect line and along sidewalls of the bottom electrode and the bottom dielectric layer, electrically coupling the lower metal interconnect line and the bottom electrode In yet other embodiments, the present disclosure relates to a method of an integrated circuit device. The method comprises forming a plurality of RRAM cell stacks in rows and column over a lower metal interconnect line, the RRAM cell stacks respectively including a bottom electrode and a top electrode separated by a RRAM dielectric having a variable resistance. The method further comprises forming a bottom contact structure on the lower metal interconnect line and along sidewalls of the bottom electrode, electrically coupling the lower metal interconnect line and the bottom electrode. The method further comprises forming an upper metal interconnect line electrically coupled to the top electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
   a lower metal interconnect line disposed within a lower inter-level dielectric (ILD) layer and an upper metal interconnect line disposed within an upper inter-level dielectric (ILD) layer; and
   a memory cell array disposed between the lower metal interconnect line and the upper metal interconnect line, including memory cells arranged in rows and columns, the memory cells respectively comprising a bottom electrode and a top electrode separated by a RRAM dielectric having a variable resistance;
   wherein a bottom contact structure is disposed on the lower metal interconnect line and along sidewalls of the bottom electrode, electrically coupling the lower metal interconnect line and the bottom electrode;
   wherein the bottom contact structure extends continuously between at least two memory cells arranged in a row direction, and comprises discrete portions between memory cells arranged in a column direction.

2. The integrated circuit device of claim 1, wherein a row distance between two neighboring memory cells in the row direction is smaller than a column distance between two neighboring memory cells in the column direction.

3. The integrated circuit device of claim 2, wherein the lower metal interconnect line extends continuously between the at least two memory cells arranged in the row direction.

4. The integrated circuit device of claim 2, wherein the upper metal interconnect line extends continuously between at least two memory cells arranged in the column direction.

5. The integrated circuit device of claim 1, wherein the bottom contact structure extends upwardly to a lateral positional higher than a lower surface of the top electrode.

6. The integrated circuit device of claim 1, wherein the top electrode is electrically coupled to the upper metal interconnect line through an upper conductive via disposed on a top surface of the top electrode.

7. The integrated circuit device of claim 1, further comprising:
   a bottom dielectric layer separating the bottom electrode and the lower metal interconnect line; and
   a top dielectric layer disposed over the lower metal interconnect line, continuously extending along sidewalls of the bottom contact structure, and overlying a top surface of the top electrode.

8. The integrated circuit device of claim 7, further comprising:
   a sidewall spacer disposed over the RRAM dielectric and along sidewalls of the top electrode, and having an outermost sidewall vertically aligned with the sidewall of the bottom electrode; and
   a hard mask disposed over the top electrode and the sidewall spacer, and having sidewalls vertically aligned with sidewalls of the top electrode.

9. An integrated circuit device, comprising:
   a plurality of lower metal interconnect lines extending in parallel with one another within a lower inter-level dielectric (ILD) layer over a substrate;
   a first plurality of bottom dielectric pads disposed over a first lower metal interconnect line and spaced apart from one another along a length of the first lower metal interconnect line;
   a first plurality of bottom electrodes disposed over the first plurality of bottom dielectric pads, respectively;
   a first plurality of RRAM dielectric structures, each having a variable resistance, disposed over the first plurality of bottom electrodes, respectively;
   a first plurality of top electrodes disposed over the plurality of RRAM dielectric structures, respectively; and
   a first bottom contact structure disposed over the first lower metal interconnect line and including a first plurality of ring-shaped contact structures that surround the first plurality of bottom electrodes, respectively, the first plurality of ring-shaped contact structures electrically coupling plurality of lower metal interconnect lines to outer sidewalls of the first plurality of bottom electrodes.

10. The integrated circuit device of claim 9, wherein the first plurality of ring-shaped contact structures adjoin one another along the length of the first lower metal interconnect line.

11. The integrated circuit device of claim 9, further comprising:
    a second plurality of bottom dielectric pads disposed over a second plurality of lower metal interconnect lines and spaced apart from one another along a length of the second lower metal interconnect line;
    a second plurality of bottom electrodes disposed over the second plurality of bottom dielectric pads, respectively;
    a second plurality of RRAM dielectric structures, each having a variable resistance, disposed over the second plurality of bottom electrodes, respectively;
    a second plurality of top electrodes disposed over the second plurality of RRAM dielectric structures, respectively; and
    a second bottom contact structure disposed over the second lower metal interconnect line and including a second plurality of ring-shaped contact structures that surround the second plurality of bottom electrodes, respectively, the second plurality of ring-shaped contact structures adjoining one another along the length of the second lower metal interconnect line and electrically coupling the second plurality of lower metal interconnect lines to outer sidewalls of the second plurality of bottom electrodes.

12. The integrated circuit of claim 11:
    wherein the first plurality of ring-shaped contact structures of the first bottom contact structure adjoin one another along the length of the first lower metal interconnect line;
    wherein the second plurality of ring-shaped contact structures of the second bottom contact structure adjoin one another along the length of the second lower metal interconnect line; and
    wherein the first bottom contact structure is spaced apart from the second bottom contact structure.

13. The integrated circuit device of claim 9, further comprising:
    a plurality of upper metal interconnect lines extending in parallel with one another and in a direction that is perpendicular to that of the plurality of lower metal interconnect lines, wherein an upper metal interconnect line couples a first top electrode of the first plurality of top electrodes to a second top electrode of a second plurality of top electrodes.

14. The integrated circuit device of claim 9, further comprising:
    a plurality of sidewall spacers disposed over the RRAM dielectric structures, respectively, wherein a sidewall spacer has an inner sidewall surrounding an outer sidewall of a top electrode and an outer sidewall vertically aligned with an outer sidewall of a bottom electrode.

15. The integrated circuit device of claim 14, further comprising:
a top dielectric layer disposed over the plurality of lower metal interconnect lines, continuously extending along sidewalls of the bottom contact structure and the sidewall spacer, and overlying a top surface of the top electrode.

16. The integrated circuit device of claim 15, further comprising:
a hard mask disposed between the top electrode and the top dielectric layer and having a sidewall vertically aligned with sidewalls of the top electrode.

17. The integrated circuit device of claim 9, further comprising:
a capping layer disposed between the RRAM dielectric and the top electrode, having a sidewall vertically aligned with a sidewall of the top electrode, wherein the capping layer has a lower concentration of oxygen than the RRAM dielectric.

18. The integrated circuit device of claim 17, wherein the capping layer comprises titanium (Ti), hafnium (Hf), platinum (Pt), or ruthenium (Ru).

19. A method of forming an integrated circuit device,
forming a plurality of RRAM cell stacks in rows and column over a lower metal interconnect line, the RRAM cell stacks respectively including a bottom electrode and a top electrode separated by a RRAM dielectric having a variable resistance;
forming a bottom contact structure on the lower metal interconnect line and along sidewalls of the bottom electrode, electrically coupling the lower metal interconnect line and the bottom electrode; and
forming an upper metal interconnect line electrically coupled to the top electrode;
wherein the plurality of RRAM cell stacks is formed by a process comprising:
forming a bottom electrode layer over the lower metal interconnect line, a RRAM dielectric layer over the bottom electrode layer, and a top electrode layer over the RRAM dielectric layer;
patterning the top electrode layer to form a top electrode;
forming a sidewall spacer alongside the top electrode; and
patterning the RRAM dielectric layer and the bottom electrode layer according to the sidewall spacer and the top electrode to form the RRAM dielectric and the bottom electrode.

20. An integrated circuit device, comprising:
a lower metal interconnect line disposed within a lower inter-level dielectric (ILD) layer and an upper metal interconnect line disposed within an upper inter-level dielectric (ILD) layer;
a memory cell array disposed between the lower metal interconnect line and the upper metal interconnect line, including memory cells arranged in rows and columns, the memory cells respectively comprising a bottom electrode and a top electrode separated by a RRAM dielectric having a variable resistance, wherein a bottom contact structure is disposed on the lower metal interconnect line and along sidewalls of the bottom electrode, electrically coupling the lower metal interconnect line and the bottom electrode;
a bottom dielectric layer separating the bottom electrode and the lower metal interconnect line; and
a top dielectric layer disposed over the lower metal interconnect line, continuously extending along sidewalls of the bottom contact structure, and overlying a top surface of the top electrode.

* * * * *